United States Patent
Tao

(10) Patent No.: US 7,023,082 B2
(45) Date of Patent: Apr. 4, 2006

(54) SEMICONDUCTOR PACKAGE AND MANUFACTURING METHOD THEREOF

(75) Inventor: Su Tao, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 5 days.

(21) Appl. No.: 10/693,897

(22) Filed: Oct. 28, 2003

(65) Prior Publication Data

US 2004/0094832 A1    May 20, 2004

(30) Foreign Application Priority Data

Nov. 18, 2002    (TW) ................................ 91133663 A

(51) Int. Cl.
*H01L 23/04*    (2006.01)
(52) U.S. Cl. ....................................... 257/698; 257/778
(58) Field of Classification Search ................ 257/698, 257/723, 724, 762, 766, 773, 778
See application file for complete search history.

(56) References Cited

U.S. PATENT DOCUMENTS

| | | | | |
|---|---|---|---|---|
| 3,311,791 A | * | 3/1967 | Larson et al. | ............... 174/52.4 |
| 6,566,747 B1 | * | 5/2003 | Ohuchi et al. | ............... 257/698 |
| 2004/0094832 A1 | * | 5/2004 | Tao | ........................... 257/698 |

* cited by examiner

*Primary Examiner*—Mark V. Prenty
(74) *Attorney, Agent, or Firm*—Bacon & Thomas

(57) ABSTRACT

A semiconductor package mainly comprises a substrate unit and a chip. The chip is electrically connected to the substrate unit. The substrate unit includes an upper surface, a lower surface and a side surface. A plurality of circuit traces are formed on the upper surface and a plurality of contacts are formed on the side surface, wherein the contacts are electrically connected to the circuit traces. Besides, a plurality of solder balls are formed on the contacts in order to transmit the signals from chip to outside through the substrate unit, the contacts and the solder balls. Furthermore, a semiconductor package module will be formed by electrically connecting the semiconductor packages with each other through solder balls and a module substrate, and mounting the semiconductor packages with each other through an adhesive layer. In addition, a method for manufacturing the semiconductor package is disclosed.

10 Claims, 4 Drawing Sheets

SEMICONDUCTOR PACKAGE AND MANUFACTURING METHOD THEREOF

BACKGROUND OF THE INVENTION

1. Field of Invention

This invention relates to a semiconductor package and a manufacturing method thereof. More particularly, the present invention is related to a semiconductor package module and a manufacturing method thereof.

2. Related Art

Integrated circuit (chip) packaging technology is becoming a limiting factor for the development in packaged integrated circuits of higher performance. Semiconductor package designers are struggling to keep pace with the increase in pin count, size limitations, low profile, and other evolving requirements for packaging and mounting integrated circuits.

Originally, a semiconductor package is formed by the steps of singulating a wafer into a plurality of chips, disposing one of the chips on a substrate, electrically connecting the chip and the substrate by conductive wires and encapsulating the chips via an encapsulation.

As shown in FIG. 1, there is provided a stacked semiconductor package. Therein, the projective area of the upper chip is larger than that of the lower chip, so the lower chip 12 can be electrically connected to the substrate 13 via the conductive wires 15. On the contrary, when the projective area of the upper chip is equal to the projective area of the lower chip, the lower chip will not be able to be connected to the substrate for that there is not enough space for wire-bonding. Accordingly, there is a restriction in such stacked package. Moreover, the conductive wire 14 is so long. Accordingly, said conductive wire 14 and said conductive wire 15 will be easily to be bonded to each other due to the molding compound sweeping the conductive wires 14 and 15. Besides, the length of the conductive wire 14 is large so as to cause the signal delay and decay, and reduce the electrical performance of said stacked package.

Next, there is provided another conventional stacked semiconductor package in FIG. 2. As FIG. 2 shown, a first chip 21 is disposed on a first substrate 22 and electrically connected to the first substrate 22 so as to form a first package. Therein, the first chip 21 can be mounted to the first substrate 22 via bumps in a flip-chip manner. In addition, the first chip 21 also can be mounted to the first substrate 22 and electrically connected to the first substrate 22 via conductive wires by the method of wire-bonding. Similarly, a second chip 23 can be electrically connected to a second substrate 24 by flip-chip bonding or wire-bonding, and a third chip 25 can also be electrically connected to a third substrate 26 by flip-chip bonding or wire-bonding. As mentioned above, in order to have the first package, the second package, the third package electrically connected to each other, there shall be provided an inter-substrate 27 as an electrical interconnection between said packages. In such a manner, a package module can be provided. For example, a plurality of memory chips can be electrically connected with each other to expand the memory capacity according to said package module. However, said package module comprises at least an inter-substrate regarded as an electrical interconnection between said packages, so the overall thickness of the package module will be increased.

Therefore, providing another semiconductor package and package module to solve the mentioned-above disadvantages is the most important task in this invention.

SUMMARY OF THE INVENTION

In view of the above-mentioned problems, an objective of this invention is to provide a semiconductor package so as to lower the overall thickness of the stacked packages or the thickness of the package module with said stacked packages.

To achieve the above-mentioned objective, a semiconductor package is provided, wherein the semiconductor package mainly comprises a substrate unit having an upper surface, a lower surface and a side surface, and a chip disposed on the substrate unit and electrically connected to the substrate in a flip-chip manner or in a wire-bonding fashion. Therein, the upper surface of the substrate unit has a plurality of circuit traces electrically connecting to the contacts formed on the side surface. Moreover, a plurality of electrically conductive devices, for example solder balls, are formed on the contacts so as to transmit the chip signal from the contacts of the substrate unit to external electronic devices through said electrically conductive devices.

In addition, there are also provided a plurality of said semiconductor packages connected to each other by adhesive layers.

Furthermore, this invention will provide a substrate for manufacturing said semiconductor package as mentioned above.

Besides, this invention also provides a manufacturing method for said semiconductor package. The manufacturing method mainly comprises the following steps. Firstly, a substrate array comprising two substrate units is provided. Therein, the substrate unit has an upper surface, a lower surface and a cutting street formed on the upper surface and connecting two substrate units. Moreover, there are a plurality of through holes formed at the cutting street and passing through the upper surface and the lower surface. Next, said substrate array is singulated along the cutting street so as to separate said substrate units into two individual substrate units, wherein each individual substrate unit has a side surface, and to separate the through holes into a plurality of recesses formed at one side surface of each individual substrate unit. Then, a chip is provided to dispose on one of said individual substrate units and electrically connected to said individual substrate unit via a plurality of bumps. Finally, a plurality of electrically conductive devices, for example solder balls, are mounted to the recesses. Thus, said semiconductor package is formed according to the steps as shown above.

Besides, the most important characterization of this invention is to provide said semiconductor package as shown above, having a substrate with a plurality of electrically conductive devices formed at one side surface of the substrate for electrically connecting to a module substrate or a motherboard. Accordingly, said semiconductor package can be stacked and electrically connected with the same one by connecting the substrates of said semiconductor packages to a module substrate or to a motherboard to form a package module. Thus, the overall thickness of the package module will be reduced.

BRIEF DESCRIPTION OF THE DRAWINGS

The invention will become more fully understood from the detailed description given herein below illustrations only, and thus are not limitative of the present invention, and wherein.

DETAILED DESCRIPTION OF THE INVENTION

The semiconductor package according to the preferred embodiment of this invention will be described herein below with reference to the accompanying drawings, wherein the same reference numbers refer to the same elements.

Figure 1:
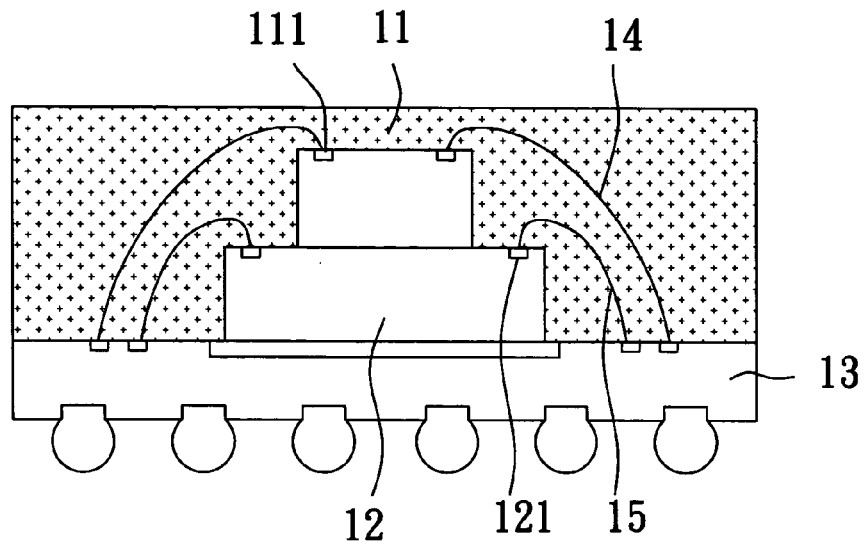
FIG. 1 is a cross-sectional view of a conventional semiconductor package.
Figure 2:
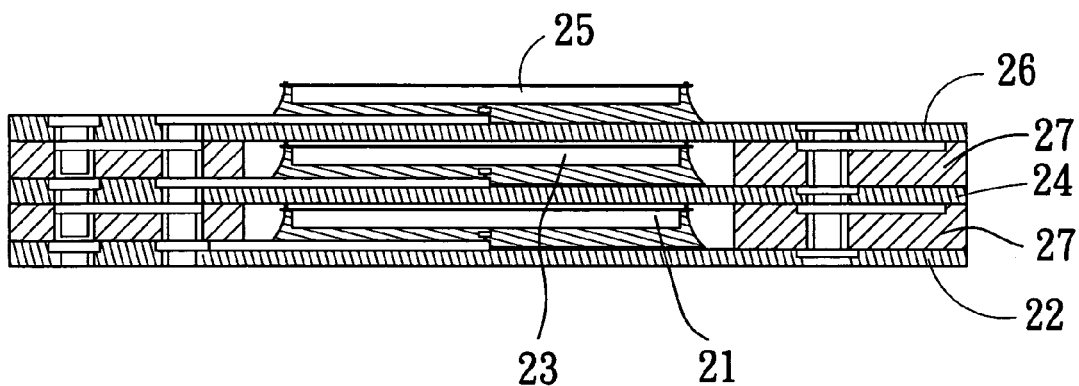
FIG. 2 is a cross-sectional view of another conventional semiconductor package.
Figure 3:
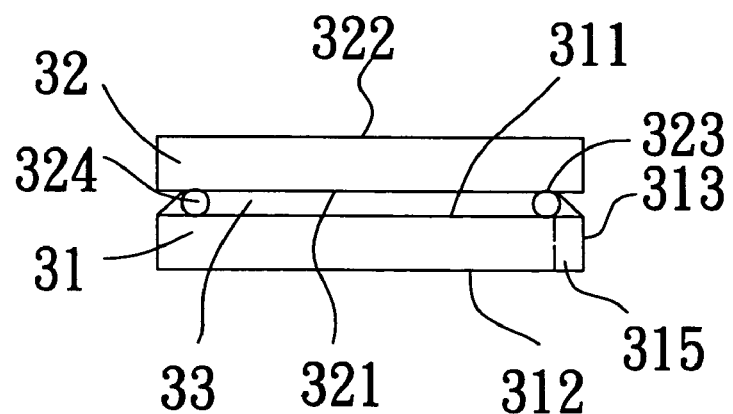
FIG. 3 is a cross-sectional view of a semiconductor package according to the preferred embodiment of the present invention.
Figure 4:
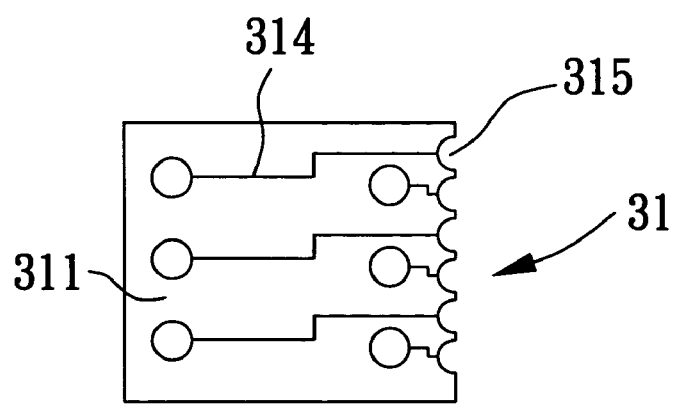
FIG. 4 is a top view of a substrate according to the preferred embodiment of FIG. 3.
Figure 5:
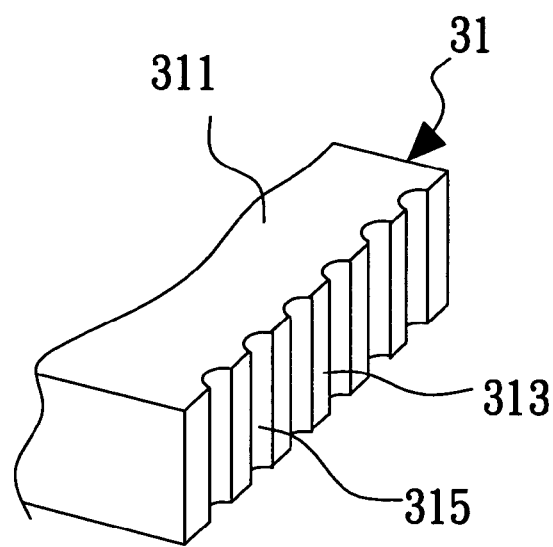
FIG. 5 is a cross-sectional view of a substrate according to the preferred embodiment of FIG. 3.
Figure 6:
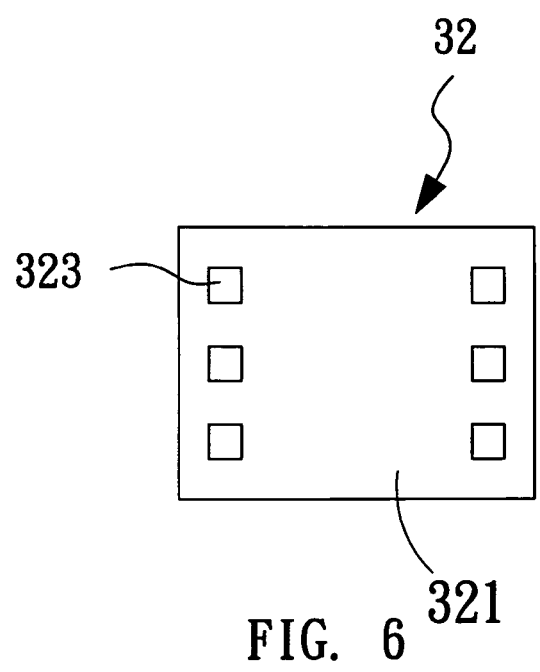
FIG. 6 is a top view of a chip according to the preferred embodiment of FIG. 3.

In accordance with the preferred embodiment as shown in FIGS. 3, 4, 5 and 6, there is provided a semiconductor package. The semiconductor package mainly comprises a substrate unit 31 and a chip 32. The substrate unit 31 has an upper surface 311, an opposite lower surface 312 and a side surface 313 connecting the upper surface 311 and the lower surface 312. Therein, there are a plurality of circuit traces 314 formed on the upper surface 311, and there are a plurality of recesses 315, for example slots as shown in FIG. 5, formed on the side surface 313, wherein each recesses 315 has a metal layer formed thereon. The recesses 315 are electrically connected to the circuit traces 314. As mentioned above, the metal layer can be a copper layer, a nickel layer and a gold layer formed on the reeessierts recesses 315 in sequence. As shown in FIG. 6, the chip 32 has an active surface 321 with a plurality bonding pads 323 formed thereon, and an opposite back surface 322. Therein, a plurality of bumps 324 are formed on the bonding pads 323 as shown in FIG. 3. In addition, the active surface 321 of the chip 32 faces the upper surface 311 of the substrate 31 and is disposed thereon via the bumps 324 for electrically connecting the chip 32 to the substrate 31. Therein, the chip 32 is made of a material of silicon; the bumps 324 are formed on the bonding pads 323 by the method of plating or screen-printing a solder material on the bonding pads 323 and then performing a reflow process.

Besides, the coefficient of thermal expansion (CTE) of the substrate 31 is different form that of the chip 32. In order to prevent the effect of the CTE mismatch due to the changes of working temperature, an underfill 33 is filled in a gap between the substrate 31 and the chip 32. Thus, the thermal stress due to the effect of CTE mismatch will mostly be reduced.

Moreover, a plurality of electrically conductive devices are mounted to the recesses 315 of the side surface 313 to electrically connect the substrate 31 and external devices, for example a package module substrate and a motherboard. Thus the signal of the chip 32 can be transmitted to external electronic devices through the substrate 31 and said electrically conductive devices. Because the recesses 315 of the side surface 313 of the substrate 31 are connected to electrically conductive devices, the recesses 315 can be regarded as contacts and replaces substrate pads formed on a lower surface of a conventional substrate.

Figure 7:
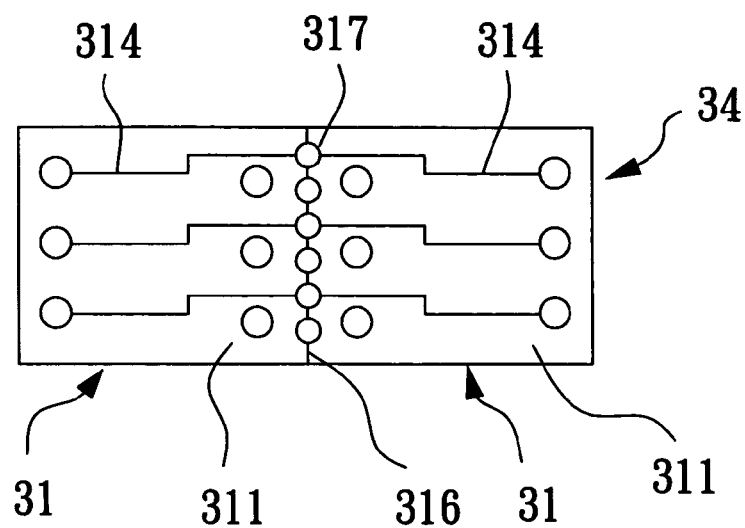
FIG. 7 is a top view of a substrate array according to the preferred embodiment of present invention.

Next, please refer to FIG. 7 to specify the forming method of the recesses 315. Firstly, a substrate array 34 is provided. Therein, the substrate array 34 comprises two substrate units 31. And the substrate array 34 has an upper surface 311, a lower surface 312 and a cutting street 316 formed between the substrate units 31. Furthermore, there are a plurality of through holes 317 formed at the cutting street 316 and passing through the upper surface 311 and the lower surface 312. The through holes 317 can be formed by the methods of mechanical drilling, laser ablation, photochemical reaction and plasma etching. Afterwards, the substrate array 34 is singulated into two individual substrate units 31 as shown in FIG. 4 so that the through holes 317 are separated into a plurality of recesses 315 formed on the side surface 313 of each individual substrate unit 31. In addition, the inner walls of the through holes 317 are plated with metal layers before the substrate array 34 is singulated. Therein, the process of plating a metal layer on the inner wall of one of the through holes 317 comprises plating a copper layer on the innerwall of the through hole 317. Because the inner wall of the through hole 317 is made of a non-conductive material, said a material for activation, for example barium, is disposed on the inner wall in advance. Then a thin copper layer is formed on said material for activation by electro-less plating, wherein the thickness of the thin copper layer is about 0.5 um. Next, a thicker copper layer is formed on said thin copper layer, wherein the thickness of the thicker copper layer is about 20 um. In addition, the copper layer can be formed by the method of direct plating. The process of direct plating comprises the following steps. Firstly, a conductive polymer layer is formed on the inner wall of the through hole 317. Next, a metal layer is formed on the conductive polymer layer by the method of plating. As mentioned, when the copper layer is plated on the inner wall of the through hole, a nickel layer and a gold layer are plated in sequence on the copper layer. Thus, the recesses 315 can be regarded as contacts for electrically connecting to external electronic devices.

Figure 8:
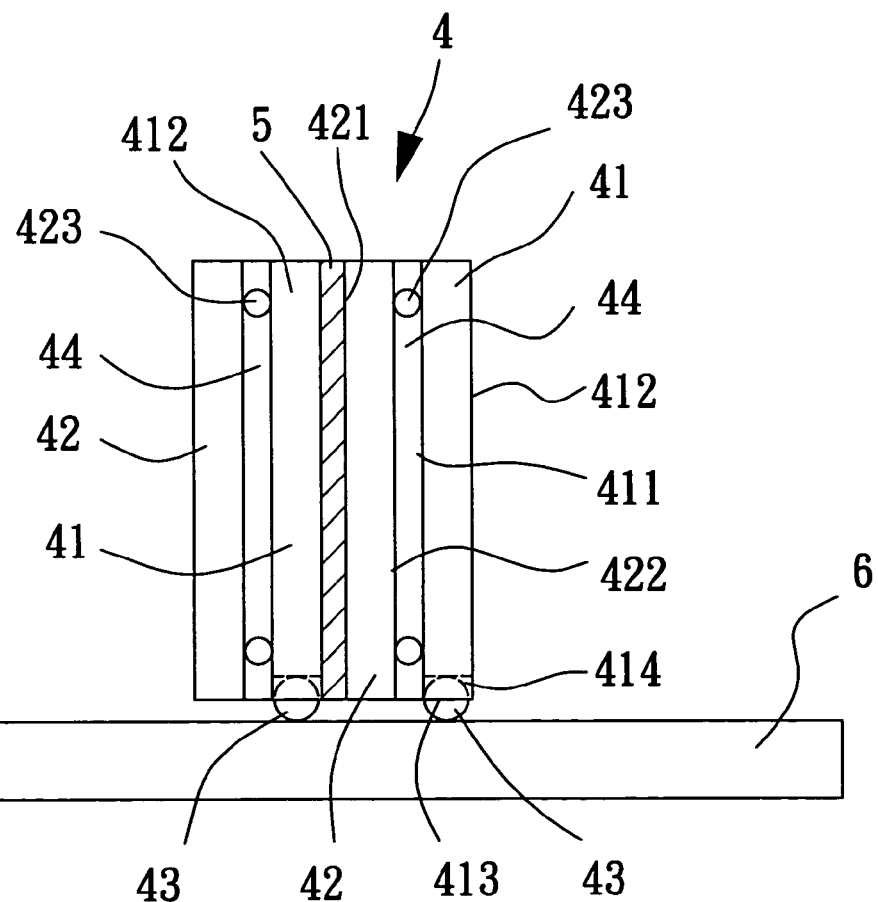
FIG. 8 is a cross-sectional view of a package module according to the preferred embodiment of the present invention.

Moreover, said semiconductor package as mentioned above can be electrically connected to another electronic devices, for example another semiconductor package with the same type, via a plurality of electrically conductive devices. Accordingly, said semiconductor package can be electrically connected to the same one to form a package module. Referring to FIG. 8, a semiconductor package module comprises two semiconductor packages 4, a plurality of electrically connecting devices 43, for example solder balls, and a module substrate 6. Therein, the semiconductor packages 4 are the same as mentioned above. Each semiconductor package 4 mainly comprises an upper surface 411, an opposite lower surface 412 and a side surface 413 connecting the upper surface 411 and the lower surface 412. There are a plurality of recesses 414 formed on the side surface 414. And a plurality of electrically connecting devices 43, for example solder balls, are formed on the recesses 414 so as to electrically connect to the module substrate 6. Moreover, the chip 42 is bonded to the substrate 41 in a flip chip manner. Then, said semiconductor packages are attached to each other by attaching a lower surface 412 of on substrate unit 41 in one package to a back surface 421 of one chip 42 in another package via an adhesive layer 5 as shown in FIG. 8.

Besides, the coefficient of thermal expansion of the substrate 41 is different from that of the chip 42 so that an underfill is disposed in a gap between the substrate 41 and the chip 42 to lower the thermal stress caused by the change of working temperature.

Although the invention has been described in considerable detail with reference to certain preferred embodiments, it will be appreciated and understood that various changes and modifications may be made without departing from the spirit and scope of the invention as defined in the appended claims.

What is claimed is:

1. A semiconductor package, comprising:
   a substrate unit having an upper surface, a lower surface, a side surface connecting the upper surface and the lower surface, a plurality of circuit traces formed on the upper surface, a plurality of recesses formed on the side surface and electrically connecting to the circuit traces, and a metal layer formed on each of the recesses; and
   a chip having an active surface and a back surface, wherein a plurality of bonding pads are formed on the active surface, a plurality of bumps formed on the bonding pads and the active surface of the chip faces to the upper surface of the substrate and is electrically connected to the substrate via the bumps.

2. The semiconductor package of claim 1, wherein the metal layer comprises a copper layer, a nickel layer and a gold layer.

3. The semiconductor package of claim 1, further comprising an underfill filled between the upper surface of the substrate unit and the active surface of the chip.

4. The semiconductor package of claim 1, wherein the substrate unit further comprises a plurality of electrically connecting devices on the metal layer.

5. The semiconductor package of claim 4, wherein the electrically connecting devices are solder balls.

6. A semiconductor package module, comprising:
   a first substrate unit having a first upper surface, a first lower surface, a first side surface connecting the first upper surface and the first lower surface, a plurality of first circuit traces formed on the first upper surface, and a plurality of first contacts formed on the first side surface and electrically connecting to the first circuit traces;
   a first chip having a first active surface and a first back surface, and disposed on the first upper surface of the first substrate unit and electrically connected to the first substrate unit;
   a second substrate unit having a second upper surface, a second lower surface, a second side surface connecting the second upper surface and the second lower surface, a plurality of second circuit traces formed on the second upper surface, and a plurality of second contacts formed on the second side surface and electrically connecting to the second circuit traces;
   a second chip having a second active surface and a second back surface, and disposed on the second upper surface of the second substrate unit and electrically connected to the second substrate unit;
   a plurality of first electrically conductive devices formed on the first contacts; and
   a plurality of second electrically conductive devices formed on the second contacts.

7. The semiconductor package module of claim 6, further comprising an adhesive disposed between the first lower surface of the first substrate unit and the second back surface of the second chip so as to attach the first lower surface of the first substrate unit to the second back surface of the second chip.

8. The semiconductor package module of claim 6, further comprising a module substrate electrically connecting the first substrate unit and the second substrate unit via the first electrically connecting devices and the second electrically connecting devices.

9. The semiconductor package module of claim 6, further comprising an underfill filled between the first upper surface of the first substrate unit and the first active surface of the first chip.

10. The semiconductor package module of claim 6, further comprising an underfill filled between the second upper surface of the second substrate unit and the second active surface of the second chip.

* * * * *